(12) United States Patent
Hague et al.

(10) Patent No.: US 8,686,515 B2
(45) Date of Patent: Apr. 1, 2014

(54) DOUBLE-GROOVE BIDIRECTIONAL VERTICAL COMPONENT

(75) Inventors: Yannick Hague, Mettray (FR); Samuel Menard, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 29 days.

(21) Appl. No.: 13/332,404

(22) Filed: Dec. 21, 2011

(65) Prior Publication Data

US 2012/0161200 A1  Jun. 28, 2012

(30) Foreign Application Priority Data

Dec. 23, 2010  (FR) ..................................... 10 61213

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |

(52) U.S. Cl.
USPC .... 257/396; 257/127; 257/288; 257/E21.042; 257/E21.056; 257/E21.053; 257/E21.352; 257/E21.361

(58) Field of Classification Search
USPC ......... 257/396, 127, 219, 288, 322, 399, 400, 257/E21.042, E21.056, E21.053, E21.352, 257/E21.361
See application file for complete search history.

(56) References Cited

U.S. PATENT DOCUMENTS

| | | | |
|---|---|---|---|
| 4,551,353 A | 11/1985 | Hower et al. | |
| 4,967,256 A * | 10/1990 | Pathak et al. | 357/38 |
| 5,479,031 A | 12/1995 | Webb et al. | |
| 5,581,095 A * | 12/1996 | Salbreux | 257/110 |
| 5,808,326 A * | 9/1998 | Bernier et al. | 257/109 |
| 5,828,089 A * | 10/1998 | Bernier | 257/173 |
| 5,986,289 A * | 11/1999 | Simmonet | 257/109 |
| 2003/0209724 A1 | 11/2003 | Casey et al. | |

FOREIGN PATENT DOCUMENTS

| | | |
|---|---|---|
| EP | 0 018 730 A2 | 11/1980 |
| EP | 0 552 905 A1 | 7/1993 |
| EP | 0552905 A1 | 7/1993 |
| GB | 2207803 A | 2/1989 |

OTHER PUBLICATIONS

French Search Report and Written Opinion dated Jun. 7, 2011 from corresponding French Application No. 10/61213.
French Search Report and Written Opinion dated Jul. 22, 2011 from related French Application No. 10/61212.
French Search Report and Written Opinion dated Jul. 19, 2011 from related French Application No. 10/61208.

\* cited by examiner

*Primary Examiner* — David Nhu
(74) *Attorney, Agent, or Firm* — Wolf, Greenfield & Sacks, P.C.

(57) ABSTRACT

A mesa-type bidirectional vertical power component, including a substrate of a first conductivity type; a layer of the second conductivity type on each side of the substrate; first regions of the first conductivity type in each of the layers of the second conductivity type; and, at the periphery of each of its surfaces, two successive grooves, the internal groove crossing the layers of the second conductivity type, second doped regions of the first conductivity type being formed under the surface of the external grooves and having the same doping profile as the first regions.

8 Claims, 3 Drawing Sheets

DOUBLE-GROOVE BIDIRECTIONAL VERTICAL COMPONENT

CROSS REFERENCE TO RELATED APPLICATIONS

This application claims the priority benefit of French patent application number 10/61213, filed on Dec. 23, 2010, entitled DOUBLE-GROOVE BIDIRECTIONAL VERTICAL COMPONENT, which is hereby incorporated by reference to the maximum extent allowable by law.

BACKGROUND

1. Technical Field

Embodiments relate to vertical bidirectional power components, and more specifically to a bidirectional Shockley diode or a triac.

Two main types of bidirectional power components can be distinguished according to the technology used for their manufacturing: planar components and mesa components.

2. Discussion of the Related Art

FIG. 1 shows an example of a planar-type bidirectional Shockley diode. This device is formed in a lightly-doped N-type substrate 1 (with typically from $10^{14}$ to $10^{15}$ atoms/ $cm^3$). A P-type well 3 is formed on the upper surface side and a P-type well 5 is formed on the lower surface side. Usually, these wells are symmetrical and of same doping.

An N-type region 7 is formed in upper well 3 and an N-type region 9 is formed in lower well 5, regions 7 and 9 being heavily doped. Regions 7 and 9 are complementary in projection and substantially of the same surface area. As shown, regions 7 and 9 are generally interrupted by emitter short-circuits.

The component periphery, between the well limit and the chip edge, is coated with an insulating layer, respectively 11 at its upper surface and 13 at its lower surface. Also at the periphery of the structure, at the edge of the chip, heavily-doped N-type rings, respectively 15 at the upper surface and 16 at the lower surface, are used as a channel stop.

The upper surface is coated with a metallization A1 and the lower surface is coated with a metallization A2. When a positive voltage is applied on terminal A1, PNPN Shockley diode 3-1-5-9 is likely to turn on, when the breakdown voltage of the reverse junction between regions 1 and 5 is exceeded. When a positive voltage is applied to terminal A2, PNPN Shockley diode 5-1-3-7 is likely to turn on when the breakdown voltage of the reverse junction between regions 1 and 3 is exceeded.

To obtain breakdown voltage that is independent of the substrate doping and accurately define the volume of the breakdown areas, an N region 17 is arranged in front of upper N region 7 at the interface between well 3 and substrate 1 and an N region 19 is arranged in front of lower N region 9 at the interface between well 5 and substrate 1. N regions 17 and 19 will be called buried regions and for example result from implantations performed before the forming of P wells 3 and 5. Thus, junction J2 between N region 17 and P well 3 and junction J1 between P well 5 and N region 19 determine the breakdown voltages of the device. Optional P-type buried regions 21 and 23 have further been shown in front of N-type buried regions 19 and 17, respectively. Buried regions 21 and 23 aim at decreasing the effective thickness of substrate 1 in each of the Shockley diodes, to decrease the on-state resistance of the protection device.

A bidirectional Shockley diode of planar type such as shown in FIG. 1 provides satisfactory results. However, in many cases, it is preferred for technological reasons to form mesa-type diodes, especially because it is much simpler to form relatively deep P regions (more than 30 µm deep for diodes adapted to breakdown voltages ranging from 50 to 400 V) with no masking.

FIG. 2 shows an example of a mesa-type bidirectional Shockley diode. To simplify the description, layers similar to that in FIG. 1 have been designated with the same reference numerals. An essential difference is that, instead of forming local P-type wells 3 and 5 on either side of the substrate, uniform P-type layers, also designated with reference numerals 3 and 5, are formed with no masking on both surfaces of the substrate. The diode is delimited by peripheral grooves, respectively 31 on the upper surface side and 33 on the lower surface side, filled with an appropriate insulating material, respectively 35 and 37, currently a glassivation. The grooves cut the junctions between the substrate and P layers 3, 5.

Generally, as compared with a planar-type diode, a mesa-type bidirectional Shockley diode, biased to a voltage smaller than its breakdown voltage, has greater leakage currents. Further, the leakage currents tend to increase during the lifetime of the component when it is submitted to external stress, such as a lengthy biasing and a high temperature. In FIG. 2, equipotential line VA2 when a positive potential difference (VA2-VA1) is applied between electrodes A2 and A1 has been illustrated with bold dotted lines. The technology used to create the mesa groove, its specific geometric shape and the nature of the passivating materials explain the distribution of the equipotential lines at the edges of the component as well as their variation in the presence of stress. The electric field thus present at the passivation-silicon interfaces is responsible for the high leakage currents.

Many solutions and mesa-type bidirectional Shockley diode structures have been provided to overcome these disadvantages. However, all known solutions are relatively complex and require additional manufacturing steps with respect to those required for the manufacturing of a component such as that illustrated in FIG. 2. The same problems are posed for triacs.

There thus is a need for a simple mesa-type vertical bidirectional power component with a low leakage current, that remains steady along time.

SUMMARY

Thus, an embodiment provides a mesa-type bidirectional vertical power component which is easy to form and which has low leakage currents, steady along time.

More specifically, an embodiment aims at forming such a vertical bidirectional power component without using steps of a different type than the steps used to manufacture a conventional mesa component such as the bidirectional Shockley diode of FIG. 2.

An embodiment provides a mesa-type bidirectional vertical power component, comprising a substrate of a first conductivity type; a layer of the second conductivity type on each side of the substrate; first regions of the first conductivity type in each of the layers of the second conductivity type; and, at the periphery of each of its surfaces, two successive grooves, the internal groove crossing the layers of the second conductivity type, second doped regions of the first conductivity type being formed under the surface of the external grooves and having the same doping profile as the first regions.

According to an embodiment, the surface area of the space between two grooves is taken up by a portion of said layer of the second conductivity type.

According to an embodiment, the first conductivity type is type N and the second conductivity type is type P.

According to an embodiment, the component is a bidirectional Shockley diode.

According to an embodiment, the component comprises a buried region of the first conductivity type under each of said regions of the first conductivity type, at the interface between the substrate and the corresponding layer of the second conductivity type, each buried region being complementary in projection with the other.

According to an embodiment, the component comprises buried regions of the second conductivity type at the interfaces between layers and substrate in front of the buried regions of the first conductivity type.

An embodiment provides a method for manufacturing a component such as hereabove, comprising the steps of:

forming a layer of the second conductivity type on both sides of a semiconductor substrate of the first conductivity type;

forming a first groove at the external periphery of the component;

forming layers of the first conductivity type at the locations operational for the power component and at the level of the first groove;

forming a second groove at the periphery of the component, internally with respect to the first groove.

According to an embodiment, the method further comprises the steps of:

filling the grooves with a passivation material; and forming upper and lower metallizations.

The foregoing and other objects, features, and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of electronic components, the various drawings are not to scale.

DETAILED DESCRIPTION

Figure 1:
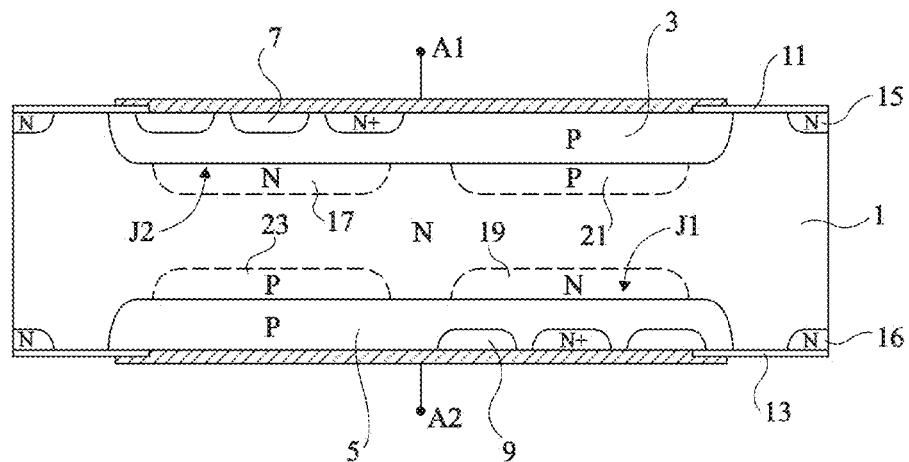
FIG. 1, previously described, is a simplified cross-section view of a planar-type bidirectional Shockley diode.
Figure 2:
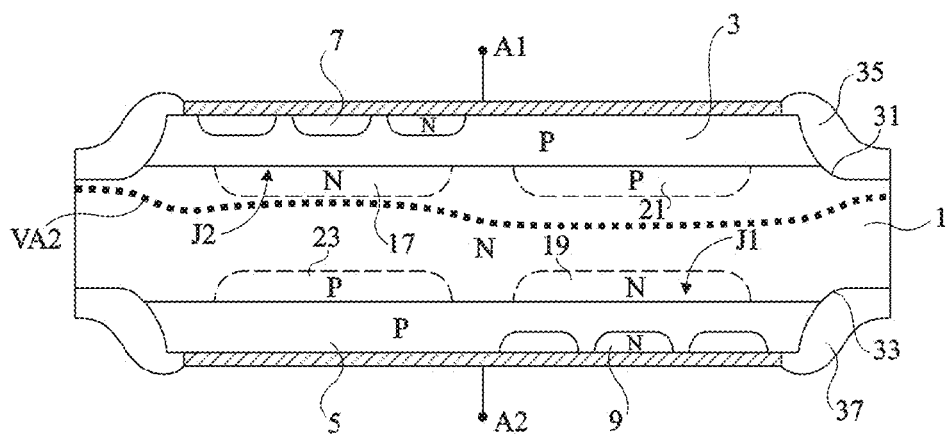
FIG. 2, previously described, is a simplified cross-section view of a mesa-type bidirectional Shockley diode.
Figure 3:
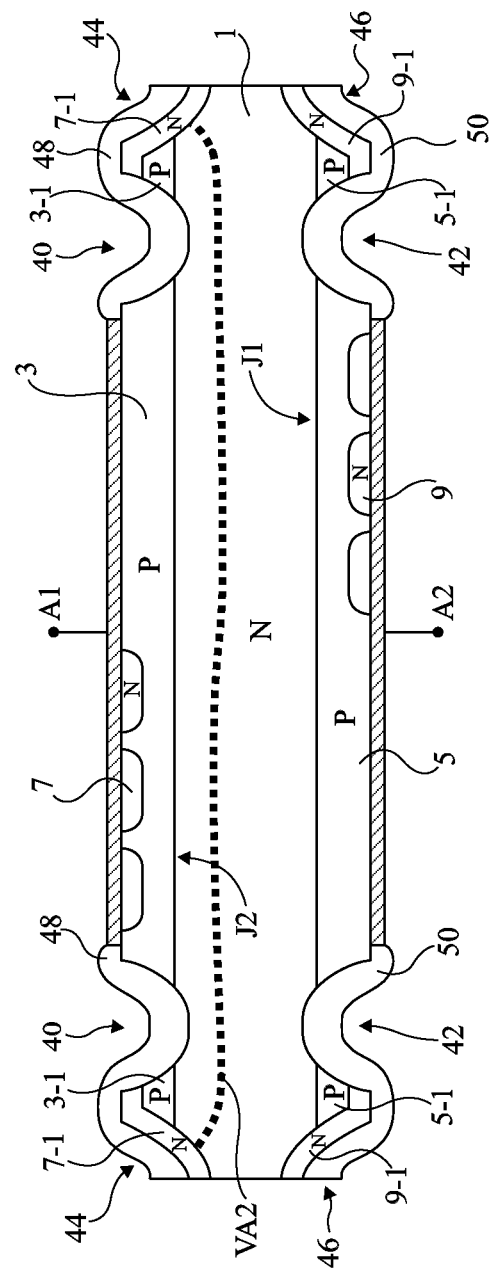
FIG. 3 is a simplified cross-section view of a bidirectional Shockley diode according to an embodiment.

FIG. 3 is a simplified view of a vertical bidirectional component. This component comprises elements common with the bidirectional Shockley diode of FIG. 2.

Thus, the component comprises, on the upper side of a substrate 1, a P-type layer 3 formed with no masking and, on the lower side of the substrate, a P-type layer 5 also formed with no masking. In layer 3 is formed an N-type region 7, generally provided with emitter short-circuits, as shown, and in layer 5 is formed an N-type layer 9 also comprising emitter short-circuits. Layer 7 and 9 are substantially complementary in projection. Layers 3 and 7 are coated with an upper surface metallization A1 and layers 5 and 9 are coated with a lower surface metallization A2. If the bidirectional component of FIG. 3 is intended to form a bidirectional Shockley diode, it will further comprise buried layers 17 and 19 such as illustrated in FIG. 2. If it is intended to form a triac, it will further comprise a gate area, not shown.

The component is surrounded with a first groove, respectively 40 on the upper surface and 42 on the lower surface, and with a second external groove (half a groove remaining after sawing), respectively 44 on the upper surface and 46 on the lower surface. Given that, as discussed previously, P-type layers 3 and 5 have been formed with no masking, there remain portions of P layer 3-1 and 5-1 in the surface of the substrate portion between the two grooves. Further, at the same time as heavily-doped N-type regions 7 and 9 have been formed, respectively, N-type regions 7-1 and 9-1 which cover the intermediary area between the two grooves and the surface of the external grooves have been formed.

Thus, there remain N-type rings, respectively 7-1 on the upper surface side and 9-1 on the lower surface side, at the component periphery, and these rings prevent equipotential line VA2 from extending beyond these N-type regions. Thus, this equipotential line cannot reach the lateral periphery of the components, which would risk causing the occurrence of non-negligible leakage currents, variable along time.

FIGS. 4A to 4F are cross-section views illustrating an embodiment of a component such as that in FIG. 3. In this series of drawings, an enlargement of the left-hand portion of a component separated from its neighbors has been shown. It should be clear that a component assembly is in fact formed by the steps described in relation with FIGS. 4A to 4F on a silicon wafer and that only at the end of the process is the wafer sawn to separate the components from one another.

Figure 4A:
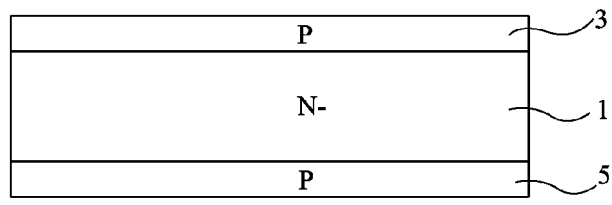
FIGS. 4A to 4F are partial cross-section views illustrating successive steps of the manufacturing of a vertical bidirectional power component such as in FIG. 3.

At the step illustrated in FIG. 4A, P regions 3 and 5 have been formed with no masking, respectively on the upper surface side and on the lower surface side of a substrate 1.

Figure 4B:
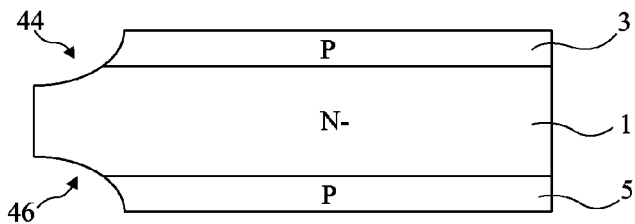

At the step illustrated in FIG. 4B, first grooves which correspond to grooves 44 and 46 of FIG. 3 have been formed, on both sides of the wafer.

Figure 4C:
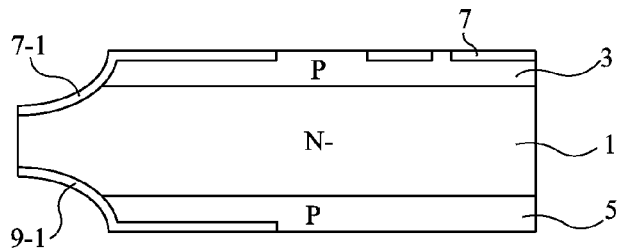

At the step illustrated in FIG. 4C, N-type regions 7 have been formed, for example, by implantation, to form an upper surface cathode region of the component. The implantation mask is selected to simultaneously form regions 7-1 at the periphery, especially in the region where peripheral groove 44 has been formed. Simultaneously, or in a subsequent step, lower surface N-type cathode regions 9 are formed and regions 9-1 are simultaneously formed at the component periphery and especially at the level of groove 46.

Figure 4D:
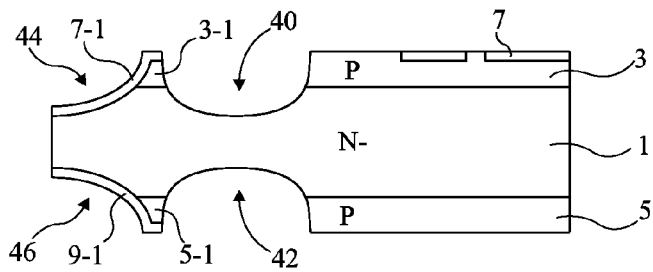

At the step illustrated in FIG. 4D, grooves 40, 42 have been formed at the periphery but towards the inside with respect to grooves 44, 46. Grooves 40, 42 are sufficiently deep to eliminate the portions of P layers 3 and 5 located at the periphery. There however remain P-type surface regions 3-1 and 5-1 in the substrate portion remaining between grooves 40 and 44 on the one hand, and 42 and 46 on the other hand.

Figure 4E:
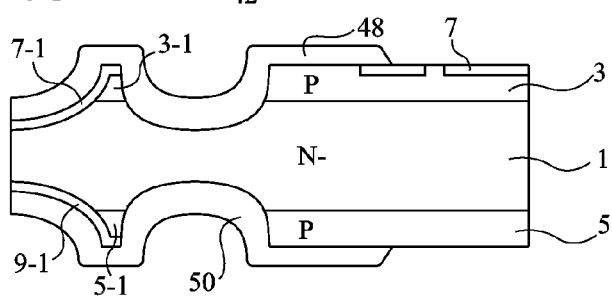

At the step illustrated in FIG. 4E, passivations, currently glassivations, 48 and 50 intended to protect the grooves have been formed.

Figure 4F:
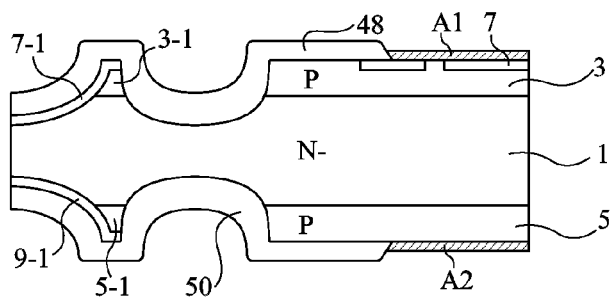

Finally, at the step illustrated in FIG. 4F, anode and cathode metallizations A1 and A2 have been formed.

This step sequence has thus effectively provided a component corresponding to that illustrated in FIG. 3.

It should be noted that this step sequence comprises no step of a different nature than the steps used to form the component of FIG. 2. Only one additional step is provided: the forming of an additional groove.

Such a structure avoids a spreading of the equipotential lines to the component periphery. The equipotential lines stop at most at the level of heavily-doped N-type regions 7-1 and 9-1 in the peripheral area of the component.

As an example of dimensions, the internal groove may have a width of 120 μm, the external half-groove having a 50-μm width, and a guard distance of 40 μm is provided for each of the grooves, between the two grooves. The peripheral protection then has a general extension of 250 μm. In a conventional mesa device such as that in FIG. 2, in which only one peripheral half-groove is provided, this half-groove has a width which ranges from 125 μm for the lowest breakdown voltages (50 V) to 225 μm for the highest breakdown voltages (1000 V for a triac). If the active portion of the chip has a dimension on the order of 2×2 or 3×3 mm$^2$, it can be observed that the size increase of the peripheral protection ranges from approximately 3% to approximately 20%. The resulting cost increase is, even in the worst case, lower than the cost increase which would result from the passing from a mesa structure to a planar structure (with the need to mask the P drive-in).

Specific embodiments of the present invention have been described. Various alterations and modifications will occur to those skilled in the art, especially as concerns the thicknesses of the various layers and the doping levels, which will be adapted to the desired breakdown voltages which will preferably range between 50 and 1000 volts.

On the other hand, a component similar to that described herein may be formed by inverting all the conductivity types of the various layers.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A mesa-type bidirectional vertical power component, comprising:
    a substrate of a first conductivity type;
    a layer of the second conductivity type on each side of the substrate;
    first regions of the first conductivity type in each of the layers of the second conductivity type;
    and further comprising, at a periphery of each of its surfaces, two successive grooves, an internal groove crossing the layers of the second conductivity type, second doped regions of the first conductivity type being formed under the surface of external grooves and having the same doping profile as the first regions.

2. The mesa-type bidirectional vertical power component of claim 1, wherein the surface area of the space between two grooves is taken up by a portion of said layer of the second conductivity type.

3. The mesa-type bidirectional vertical power component of claim 1, wherein the first conductivity type is type N and the second conductivity type is type P.

4. The mesa-type bidirectional vertical power component of claim 1, forming a bidirectional Shockley diode.

5. The mesa-type bidirectional vertical power component of claim 4, comprising a buried region of the first conductivity type under each of said regions of the first conductivity type, at the interface between the substrate and the corresponding layers of the second conductivity type, each buried region being complementary in projection with the other.

6. The mesa-type bidirectional vertical power component of claim 5, comprising buried regions of the second conductivity type, at the interfaces between layers and substrate in front of the buried regions of the first conductivity type.

7. A method for manufacturing the mesa-type bidirectional vertical power component of claim 1, comprising the steps of:
    forming a layer of the second conductivity type on both sides of a semiconductor substrate of the first conductivity type;
    forming a first groove at the external periphery of the component;
    forming layers of the first conductivity type at the locations operational for the power component and at the level of a first groove;
    forming a second groove at the periphery of the component, internally with respect to the first groove.

8. The method of manufacturing the mesa-type bidirectional vertical power component of claim 7, further comprising the steps of:
    filling the grooves with a passivation material; and
    forming upper and lower metallizations.

* * * * *